(12) United States Patent
Finney

(10) Patent No.: US 7,613,964 B2
(45) Date of Patent: Nov. 3, 2009

(54) RELAY DEVICE AND CORRESPONDING METHOD

(75) Inventor: Dale Finney, Oshawa (CA)

(73) Assignee: General Electric Company, Schenectady, NY (US)

( * ) Notice: Subject to any disclaimer, the term of this patent is extended or adjusted under 35 U.S.C. 154(b) by 274 days.

(21) Appl. No.: 11/617,124

(22) Filed: Dec. 28, 2006

(65) Prior Publication Data

US 2008/0157775 A1 Jul. 3, 2008

(51) Int. Cl.
*G01R 31/28* (2006.01)

(52) U.S. Cl. ...................... 714/724; 714/738

(58) Field of Classification Search .................. 714/724, 714/699, 799, 745, 738, 736, 740; 324/418; 702/108, 120, 124
See application file for complete search history.

(56) References Cited

U.S. PATENT DOCUMENTS

| | | | |
|---|---|---|---|
| 4,814,712 A | 3/1989 | Burton et al. | |
| 7,005,856 B2 * | 2/2006 | Deak et al. | 324/418 |
| 7,053,624 B2 | 5/2006 | Klijn et al. | |
| 7,155,362 B2 * | 12/2006 | Edwards et al. | 702/124 |
| 7,180,297 B2 * | 2/2007 | Deak et al. | 324/418 |
| 7,248,986 B2 | 7/2007 | Klijn et al. | 702/115 |
| 7,415,377 B2 * | 8/2008 | Klijn et al. | 702/115 |

* cited by examiner

*Primary Examiner*—Phung M Chung
(74) *Attorney, Agent, or Firm*—GE Global Patent Operation; Roger C. Phillips; Alberta Vitale

(57) ABSTRACT

The invention consists of a relay device including: at least one mode change device for changing the relay device from a normal mode to a test mode; an interface for receiving test script from a source; a waveform generator for running the test script received from the source and outputting test results, wherein the source signals the relay to switch from the normal mode to the test mode; a logic device for providing a logic output to the waveform generator when the relay is in test mode and setting the waveform generator to a predetermined value; a data preparation component for calculating current and voltage samples from power system input data; and a data processor for performing phasor estimation and frequency tracking of the current and voltage samples from the power system input data and performing protection calculations to determine the output of the relay.

18 Claims, 10 Drawing Sheets

```
SIMULATION Enabled

Frequency    60 Hz    Harmonic    3

Ch   Mag         Phase       H Cont.
1    0.500 A     0.0°        0.000%
2    1.500 A     120.0°      0.000%
3    0.500 A     -240.0°     0.000%
4    0.000 A     0.0°        0.000%
5    69.28 V     0.0°        0.000%
6    50.00 V     120.0°      0.000%
7    69.28 V     -240.0°     0.000%
8    0.000 V     0.0°        0.000%

Mode      Prefault        Fault Time    0 ms
Disable         Prefault       Fault      Postfault      BACK
```

FIG. 10

```
Prefault

Frequency    60 Hz

Ch   Mag         Phase       H Cont.
1    0.200 A     0.0°        0.000%
2    0.200 A     120.0°      0.000%
3    0.200 A     -240.0°     0.000%
4    0.000 A     0.0°        0.000%
5    69.28 V     0.0°        0.000%
6    69.28 V     120.0°      0.000%
7    69.28 V     -240.0°     0.000%
8    0.000 V     0.0°        0.000%

Trigger Operand    VI 1      Trigger Time   12:00.000
  >          <              UP       DOWN        BACK
```

FIG. 11

RELAY DEVICE AND CORRESPONDING METHOD

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention relates in general relays and, more particularly, to power system protective relays.

2. Description of the Related Art

The electrical power system in the United States generates three-phase alternating current (AC) electrical power. Each power phase is 120 degrees out of phase (plus or minus) with the other two power phases. The voltage of any phase oscillates sinusoidally between positive voltage and negative voltage. It is more efficient to transmit electrical power at high voltage levels than at low voltage levels. Electrical power is generated as three-phase AC power at moderate voltage and is stepped up to the 110 kV to 1000 kV range using a transformer for transmission over long transmission lines.

Switchgear is employed to control the transmission systems. The switchgear may comprise circuit breakers, fuses, switches, and relays. Electrical power distribution protective relays, referred to herein as relays, monitor a variety of electric power distribution parameters and control switchgear based on the state or condition of the electric power distribution parameters. For example, if too much current is being provided to a local distribution line, a relay may command a circuit breaker or switchgear to open, thus interrupting the supply of electrical power to that local distribution line. Current, voltage level, frequency, phase, and other parameters may be monitored by relays.

Relays vary in complexity from electromechanical devices monitoring a single parameter to microprocessor-controlled relays capable of monitoring many independent parameters concurrently. The relays are capable of changing their behavior when reprogrammed for monitoring various characteristics of a power distribution system. For safe and reliable operation of the power distribution system it is necessary to thoroughly test relays in the power distribution system at periodic intervals. Failures of the power distribution system can result in significant economic losses and inconvenience, and perhaps danger to people requiring special medical services dependent on electrical power distribution. For these reasons, periodic testing of the electric power system is mandated by government regulations. This periodic testing has been accomplished by connection of external test equipment to a relay for testing (i.e. Relay-Under-Test (RUT)). The external test equipment can be individual devices interconnected, or a consolidated test system or other external configurations. Significant testing effort is required by power companies and the like (i.e. medium voltage industrial plants), to confirm continued correct operation of relays.

Individual external test equipment 97 comprise a multitude of individual components used to perform testing, the equipment can include, for example, multimeters, clamp meters, portable appliance testers, oscilloscopes, spectrum analyzers, frequency counters, circuit breaker analyzers, signal generators and meters. The devices require special knowledge and training for interconnection, as well as connection to a relay subject to testing.

In addition to individual test components external to the relay, various test systems (i.e., special microprocessor based test devices in a single package (not shown)) have been used to test power system protective devices. With both electromechanical and electronic type relays a relay test system is temporarily connected with the relay trip unit circuit to test the response of the relay to various types of power system problems including overcurrent, undercurrent, line-line fault, line-ground faults, harmonic introductions, phase shifts, etc. Testing can also occur where the system monitors the relay's response to various input signals provided by the system. Some consolidated test equipment is commercially available, for example a single package Circuit Breaker and Overload Relay Test Sets, which are external to the relay and require correct connection thereto in order to perform properly.

Testing of relays has traditionally been accomplished through imitation of various input signals that the relay might be subject to, by emulating the input signals such as theoretical fault characteristics of a power distribution or generation system, thereby validating design elements associated with protection systems on a power distribution or generation system. Emulation can be considered an attempt to copy, as closely as possible, data from a real process (for example, data recorded by a device at a point in the power system). This emulation consists of various parameter characteristics associated with the power distribution system during a fault. Fault conditions (such as, current, voltage level, frequency, phase, and harmonics changes), generated through emulation, are therefore applied to the relay, and expected results are anticipated, validated or settings corrected for correct operation when the relay is applied in an actual power distribution system. Data imitation can also be performed by using current and voltage data recorded by a digital fault recorder located at a particular position in the power system; this data is only good for testing a relay that is located at the same point in the power system. Emulation data does not accurately represent actual power system values therefore the prior art test can be inaccurate and produce inaccurate results.

Much prior art relay test equipment 97 have multiple external signal generators to generate signals to test one or more relays. The systems include a controller to provide inputs for use by the signal generators to generate the signals. The systems can also include controller that could be hand held and include a user interface to communicate with the controller and to receive and display relay test information and to input control information for a user/test engineer.

In the prior art, one such package of external test equipment in essentially one enclosure is a relay test device 97 having a plurality of signal generators to generate signals to test one or more relays. The system includes a controller to provide inputs for use by the signal generators to generate the signals. The testing includes selecting to initiate a test of a relay by a user via an input of a hand-held controller (not shown) of the relay test device 97 and provides for transmitting an input signal to a control module of the relay test device 97 based on the user input, and initiating testing of the relay in response to the input signal. The testing also includes generating test signals by a generator of the relay test device 97 to test the relay, and capturing, by the control module, the results of the relay testing. The method also provides for displaying at least a portion of the relay testing information on a display of the hand-held controller.

Relays may be tested employing relay test equipment 97 with powerful power supply and amplifier and employing a separate personal computer (PC) to control the relay test equipment 97. The relay test equipment 97 may be relatively dumb and may depend upon the separate PC to provide the intelligence needed to test relays.

The use of various test equipment to attempt to produce or emulate theoretical fault conditions can be riddled with error sources such as incorrect settings, unmatched actual fault conditions, human error, etc. These errors cause inaccurate testing and hence affect the reliability of the electric power system. Personnel make mistakes in the process of isolating the relay and connecting the external test equipment. This can have a serious consequence for power system operation that is reviewed with respect to load loss and reliability. Additionally the cost of external test equipment and related training costs are very high.

Also, a relay test operator typically must have relatively advanced knowledge of relays and electrical power distribution to test the relays employing the relay test equipment 97. Personnel with advanced knowledge may be in limited supply, increasing the electrical power company's labor cost due to competition to hire limited skilled personnel or delaying testing due to shortages of skilled operators. In addition, the test operator must take special precautions to keep from accidentally tripping load from the electric power system and also to maintain a safe work environment. All of these precautions cumulatively can create a stressful work environment that influences the introduction of errors and accidents. Sometimes testing is carried out incorrectly, thus causing confusion regarding whether the Relay-Under-Test (RUT) is functioning correctly.

BRIEF DESCRIPTION OF THE INVENTION

One or more of the above discussed or other disadvantages may be overcome by an embodiment of the present invention, in which a relay device including: at least one mode change device for changing the relay device from a normal mode to a test mode; an interface for receiving test script from a source; a waveform generator for running the test script received from the source and outputting test results, wherein the source signals the relay to switch from the normal mode to the test mode; a logic device for providing a logic output to the waveform generator when the relay is in test mode and setting the waveform generator to a predetermined value; a data preparation component for calculating current and voltage samples from power system input data; and a data processor for performing phasor estimation and frequency tracking of the current and voltage samples from the power system input data and performing protection calculations to determine the output of the relay.

In another embodiment of the present invention is a method of operating a relay device, the method comprising the steps of: providing a mode change device for switching the relay device from a normal mode to a test mode; providing an interface for receiving test script from a source; generating a waveform for running the test script received from the source and outputting test results, wherein the source signals the relay to switch from the normal mode to the test mode; providing a logic output from a logic device to the waveform generator when the relay is in test mode; setting the waveform generator to a predetermined value; calculating current and voltage samples from power system input data using a data preparation component; performing phasor estimation and frequency tracking of the current and voltage samples from the power system input data using a data processor; and determining the test data output of the relay with the data processor.

In yet another embodiment of the present invention, a computer program product comprising: a program storage device readable by a relay device, tangibly embodying a program of instructions executable by the relay device to perform method steps for operating the relay device, the method steps comprising: providing a mode change device for switching the relay device from a normal mode to a test mode; providing an interface for receiving test script from a source; generating a waveform for running the test script received from the source and outputting test results, wherein the source signals the relay to switch from the normal mode to the test mode; providing a logic output from a logic device to the waveform generator when the relay is in test mode; setting the waveform generator to a predetermined value; calculating current and voltage samples from power system input data using a data preparation component; performing phasor estimation and frequency tracking of the current and voltage samples from the power system input data using a data processor; and determining the test data output of the relay with the data processor.

The above brief description sets forth rather broadly the more important features of the present invention in order that the detailed description thereof that follows may be better understood, and in order that the present contributions to the art may be better appreciated. There are, of course, additional features of the invention that will be described hereinafter and which will be for the subject matter of the claims appended hereto.

In this respect, before explaining several embodiments of the invention in detail, it is understood that the invention is not limited in its application to the details of the construction and to the arrangements of the components set forth in the following description or illustrated in the drawings. The invention is capable of other embodiments and of being practiced and carried out in various ways. Also, it is to be understood, that the phraseology and terminology employed herein are for the purpose of description and should not be regarded as limiting.

As such, those skilled in the art will appreciate that the conception, upon which disclosure is based, may readily be utilized as a basis for designing other structures, methods, and systems for carrying out the several purposes of the present invention. It is important, therefore, that the claims be regarded as including such equivalent constructions insofar as they do not depart from the spirit and scope of the present invention.

Further, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. Accordingly, the Abstract is neither intended to define the invention or the application, which only is measured by the claims, nor is it intended to be limiting as to the scope of the invention in any way.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 10 through 13 illustrate exemplary screen shots of the human machine interface of an embodiment of the present invention, a relay with integrated test capabilities;

DETAILED DESCRIPTION OF THE PREFERRED EMBODIMENTS

Figure 1:
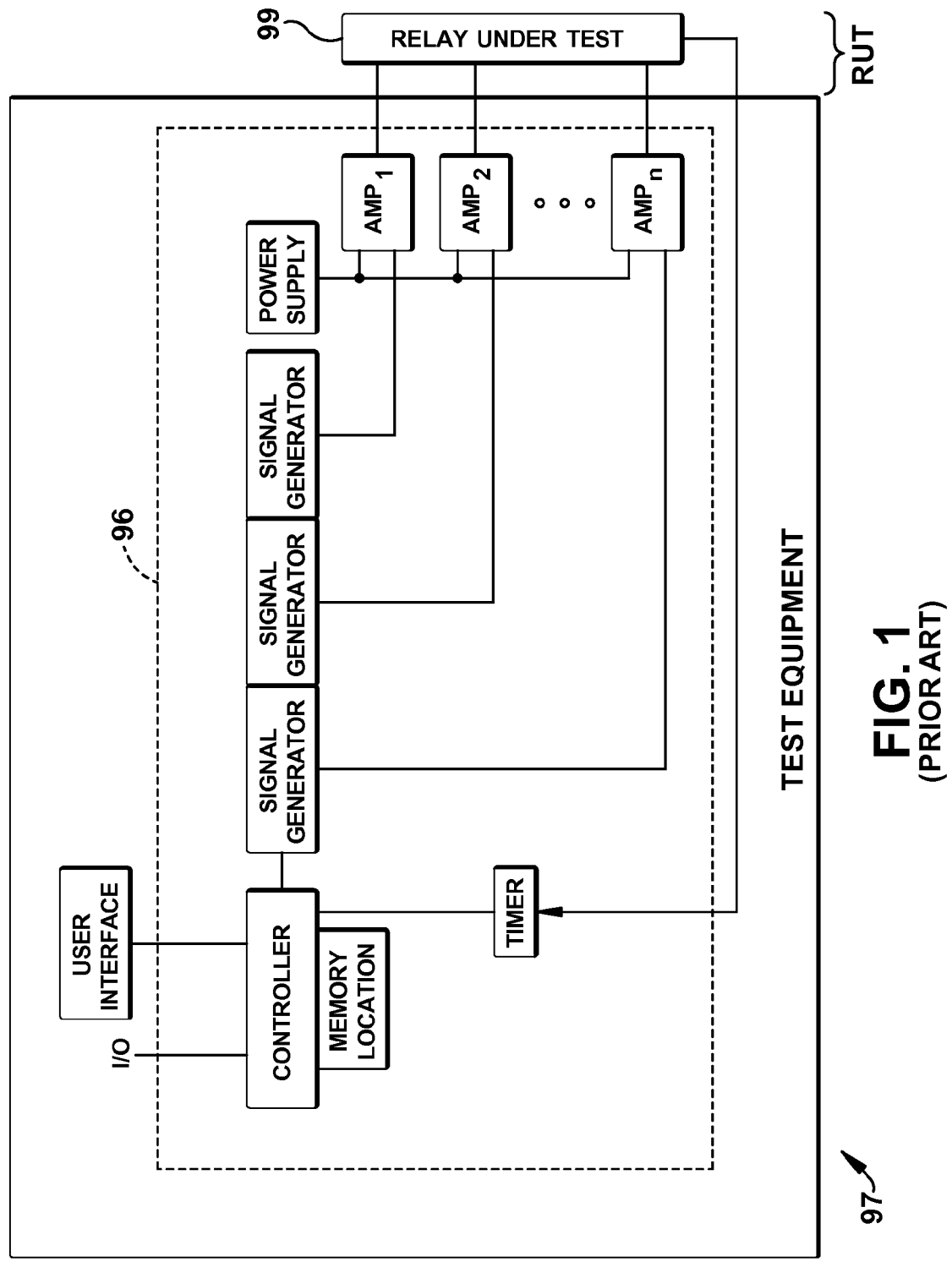
FIG. 1 illustrates a block diagram of a prior art relay test set connected to a Relay-Under-Test.

Referring now to the drawings, wherein like reference numerals designate identical or corresponding parts throughout the several views, one of the embodiments of the relay with integrated test capabilities of embodiments of the present invention the invention will be described. One of the advantageous aspects of an embodiment of the invention described here is a novel test features integrated into the relay of the present invention so that in test mode the relay of the present invention is a Relay-Under-Test. The test features use simulated data which can be created from the power system to test the relay of the present invention. Waveform of present invention is generated based upon user preferences; the user designs signal(s) to inject into the relay. These and other features and advantages will be more clearly understood from the following detailed description taken in conjunction with the accompanying drawings and claims.

Prior Art Relay-Under-Test

FIG. 1 illustrates a block diagram of a prior art relay test equipment 97 connected to a relay 99. When the relay is connected to test equipment 97 and being tested it is called a Relay-Under-Test (RUT). In the prior art, test equipment 97, which can comprise multiple pieces of electrical equipment interconnected to test the relay, is separate from the Relay-Under-Test 97. The prior art relay test equipment 97 generally comprises an external signal generator component to generate signals to test the relay, and an external amplifier to amplify the signals generated by the signal generator component. The relay test equipment 97 of the prior art can also includes a hand-held controller coupled to the external relay test equipment 97 for communications regarding the testing of the relay(s) by the signal(s) generated by the signal generator component of the test equipment 97. A notebook computer or other personal computer system could also be use as an interface.

In an example prior art embodiment of FIG. 1, a block diagram of programmable relay test equipment 97 is depicted. The relay test equipment 97 includes a controller, a signal generator module which may include one or more signal generators, a plurality of signal amplifiers and a power supply. A user interface (UI) is coupled to the controller and provides command inputs and displays test results. The controller, the signal generator module, the signal amplifiers, and the power supply are retained by an enclosure 96 shown with dotted lines; however much prior art test equipment is made up of a multitude of individual devices (i.e. signal generator, meter, oscilloscope) interconnected without an enclosure.

The controller in the prior art embodiment of FIG. 1 includes a power supply, a controller with memory, several signal generators, amplifiers and a timer as well as integrated logic circuit (not shown). The CPU of the controller employs an operating system. The controller also comprises multiple interfaces, referred to as input/output (I/O). These interfaces allow the relay test-device to communicate with other devices (not shown).

Further, in the prior art illustrated for example in FIG. 1, the controller stores, in one or more of the memory devices, a test procedure or test program that are executed to sequence the relay test equipment 97 through the steps of testing the Relay-Under-Test 99. The controller communicates with the signal generator module and controls the signal generator module to produce desirable test signals. The controller monitors the Relay-Under-Test 99 throughout the test(s), determines a result of the test(s) of the Relay-Under-Test 99, and sends the result to the user interface (UI) to be displayed.

Signal generators used in protection relay testing typically utilize power levels voltages of 5 volts to 300 volts at impedances that vary from less than one-tenth Ohm to as much or more than 600 Ohms, and, in some embodiments, focus on 50 and 60 Hz line rates. The signal generator module may generate complex signals from waveform components using a computer program, software, or firmware stored in memory and may playback periodic waveforms stored in data tables, as well as playback a signal recorded by a digital fault record (DFR) (not shown) or a relay 99 or other recording device. The signal generator module is using emulated data or actual data from a DFR. While a DFR record can be used to test a relay but DFR record based testing uses relay test equipment 97.

A DFR is an example of a dynamic test where the overall operation of all of the sub-systems in the relay are tested together. Ideally it tests whether the relay and its functions have been designed to meet the customer's protection requirements of the user.

A more conventional or static test involves injecting various signals to measure the thresholds of all of the various comparators, timers, and associated logic of a relay. A series of such tests is devised to test each of the various subsystems in the relay. The purpose of this type of testing is to confirm that the relay is working and that the final settings have been applied. The results are very easy to interpret often consisting of pass or failure.

Present Invention

An embodiment of the relay of the present invention focuses on static testing which can be easily interpreted by the test operator and since static testing is familiar in relay testing and therefore a trusted test convention. It should be noted that the relay of the present invention is designed such that dynamic (such as DFR) testing could also be implemented by one of ordinary skill in the art. In the examples discussed infra, static testing is discussed. An embodiment of the relay of the present invention has an internal test set and therefore can be tested without using the prior art external test equipment 97.

As compared to the DFR, the relay of an embodiment of the present invention works with appropriate impedance at the relay. Whereas, prior art implementing the waveform captured by the DFR into the relay test can only determine if the relay operates properly where fault was captured (and with the impedance where the fault was captured). The prior art captures a fault recording, downloads the data from the fault recording into test equipment 97, and injects current and voltage data into the Relay-Under-Test 99. Hence, the prior art relay test set uses DFR recorded signals to generate test signals based upon a recorded signal snapshot from the DFR. The prior art relay would see a representation of a real fault created from the DFR snapshot; the prior art relay does not use the simulated current and voltage of the present invention.

An embodiment of the relay of the present invention uses signals derived by the user. Also, an embodiment of the relay of the present invention modulates signal generators to modify signal on the power system. These signals are used to obtain simulated current and voltage of the present invention.

Figure 2:
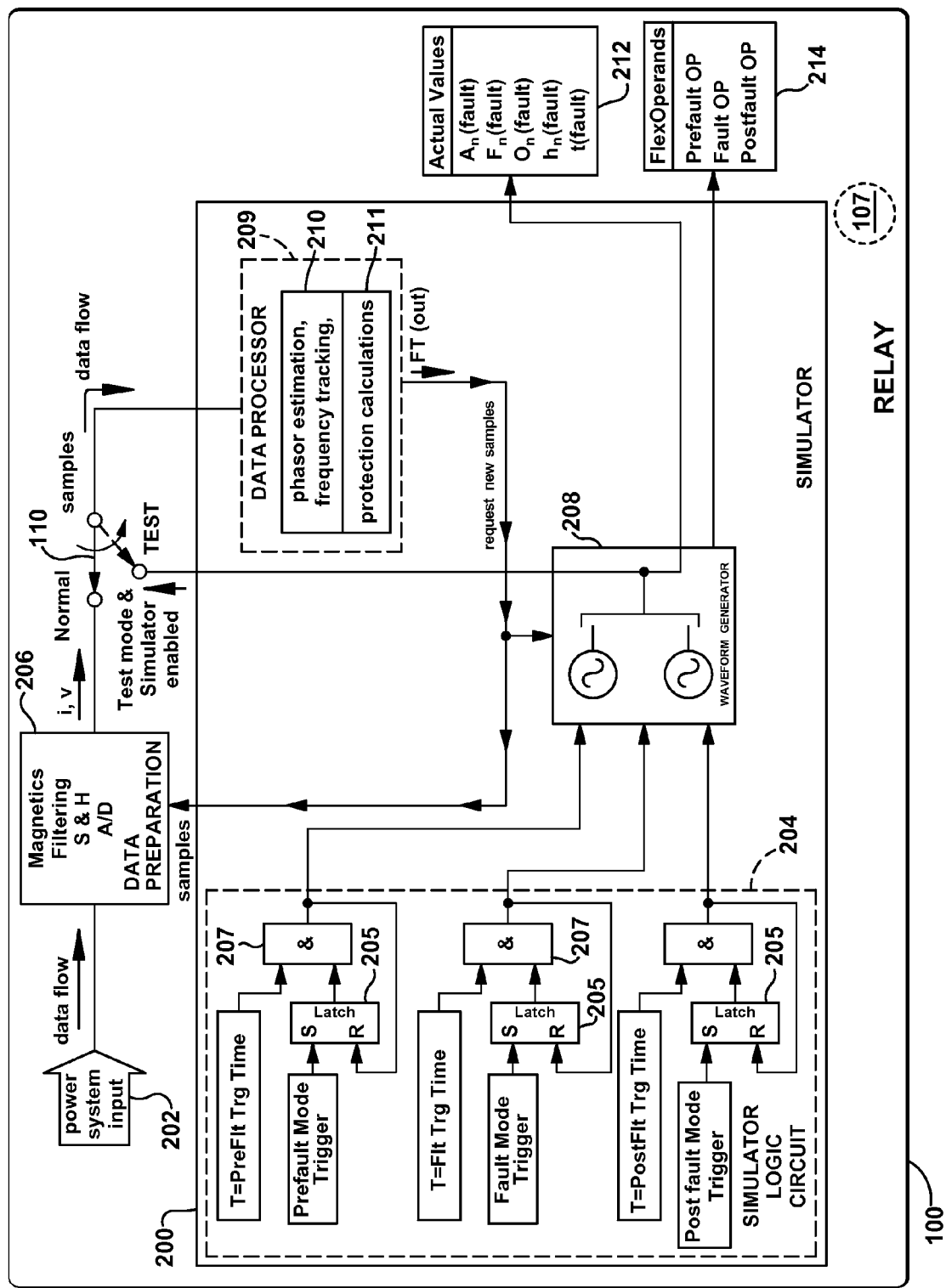
FIG. 2 illustrates a block diagram of an embodiment of the present invention, a relay with integrated test capabilities, detailing a simulator component of the relay with integrated test capabilities.

FIG. 2 illustrates a block diagram of an embodiment of the present invention, a relay with integrated test capabilities, detailing a simulator 200 component of the relay with integrated test capabilities. The simulator comprises various subcomponents that operate to provide test data, inputs and outputs, and control the relay operation, when the relay of the present invention is in test mode i.e., Relay-Under-Test. In other words, the simulator 200 resides in the relay 100 of FIG. 14 infra. (also referred to as a substation Intelligent Electronic Device (IED)) and in the relay 100 configuration software (not shown). A test button 107 is shown in phantom lines, as an alternate embodiment for switching the relay to test mode.

Figure 4:
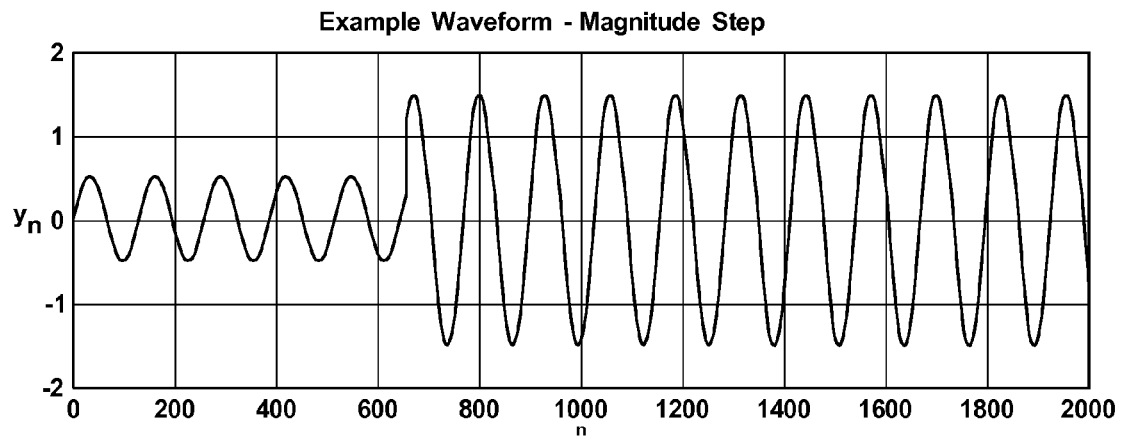
FIGS. 4 through 9 illustrate exemplary waveforms that are provided by a simulator component of an embodiment of the present invention, a relay with integrated test capabilities.
Figure 5:
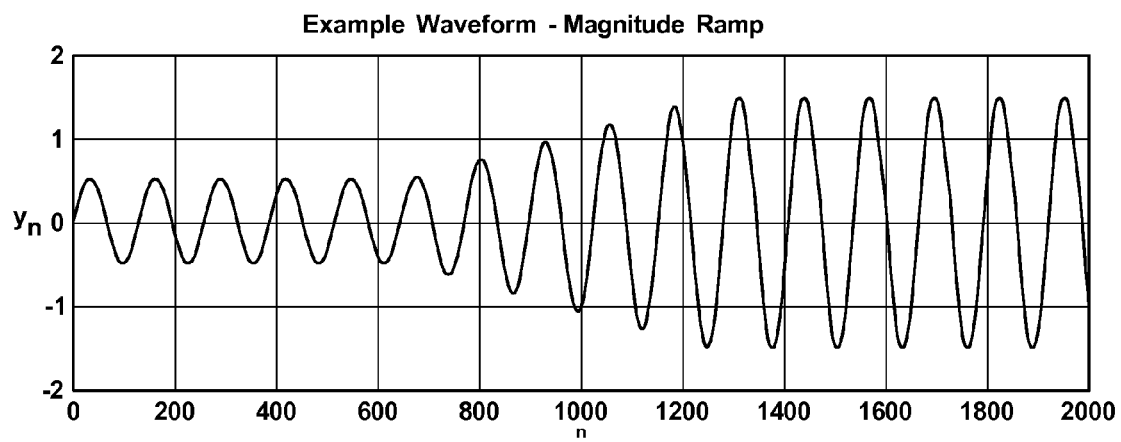
Figure 6:
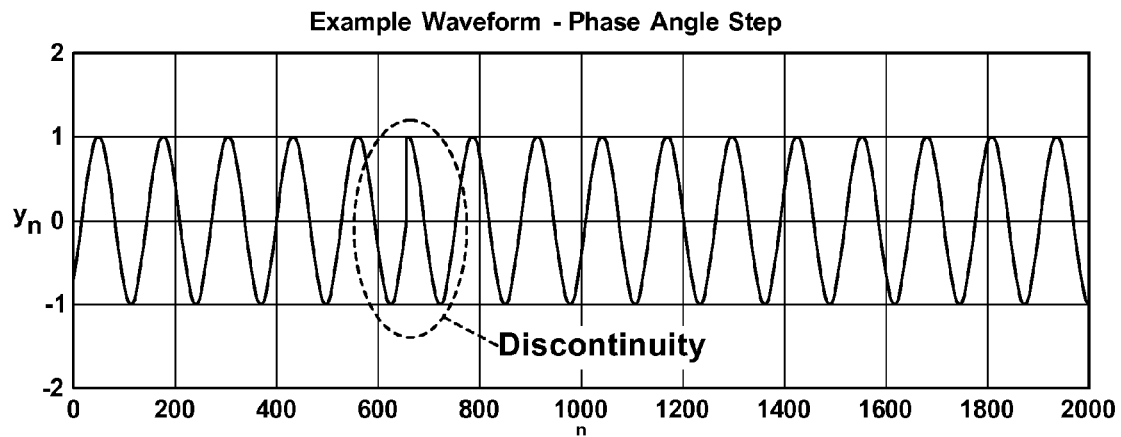
Figure 7:
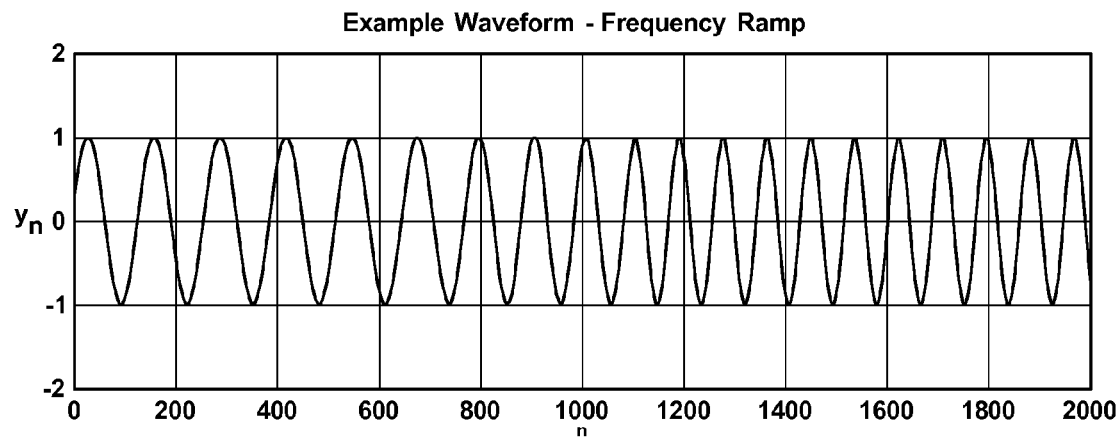
Figure 8:
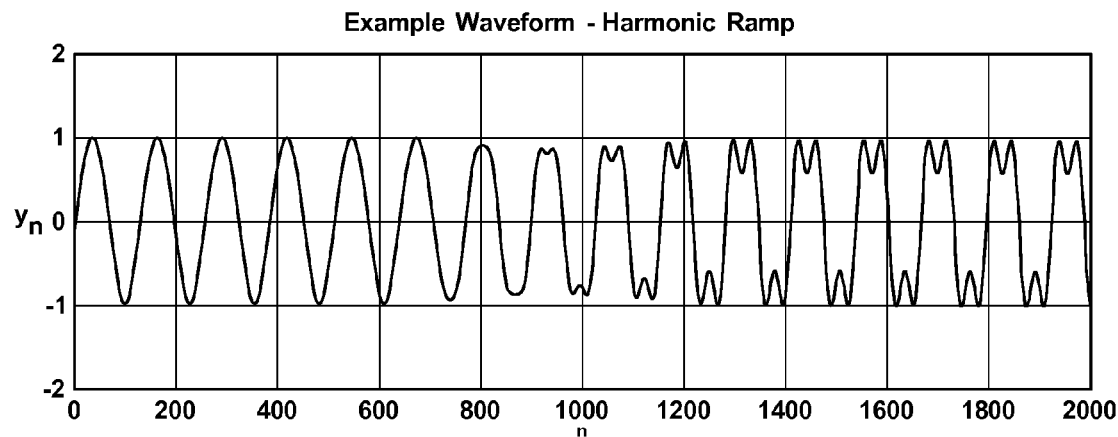
Figure 9:
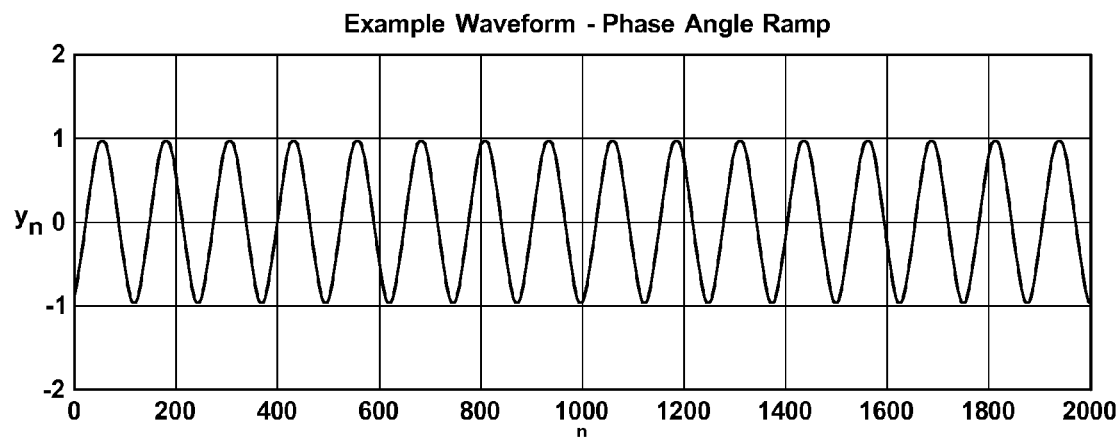

The function of the simulator component 100 is described as follows. The simulator is a firmware-based, programmable signal generator. In the present exemplary embodiment, up to 24 channels may be individually defined. A waveform or signal generator component 208 of the simulator produces samples that are rerouted to the voltage and current inputs of data processor 209 component (when the relay is in test mode, shown with phantom arrow S (switch)) in order to verify that protective functions and associated logic are programmed correctly. The data preparation component 206 performs the functions of 1) magnetics filtering, which cleans up the input signal and removes data that is not of interest (i.e. transforms data to low energy such as 5V; filters out 60 Hz voltage and current; filters out noise); 2) analog to digital conversion (in test mode, a digital representation of voltage and current are output from the data preparation component 206); and 3) sample and hold (for holding the analog voltage and current values steady while the analog to digital converter performs a conversion of analog voltage and current values to digital signals). Exemplary functions such as step and ramp functions for magnitude, frequency, angle, and harmonic content are implemented for testing purposes and are illustrated infra. in FIGS. 4 through 9. In the present embodiment, three programmable triggers are processed in the simulator logic control component 204 (illustrated by dashed lines around control component 204) and enumerated as prefault, fault and postfault modes control the simulator 200. Latch modules 205 and "and" 207 operands function in the logic circuit for each mode. The actual values for magnitude, frequency, angle, harmonic content, and elapsed time are captured at the time of trigger and will be discussed further infra. in the description of FIG. 4. An advanced feature of the simulator is coordinated testing, which may be carried out using multiple relays (not shown) of the present invention if they are time-synchronized; time synchronization may be determined by one of ordinary skill in the art. In the present embodiment, the time synchronization feature may be enabled while the multiple relays being tested are in test mode.

In test mode, the test switch 110 of the simulator of FIG. 2 is moved to test position (shown with dashed lines). Test mode is triggered by an input to the relay 100 using, for example, a USB drive 106 (shown in FIG. 14) to input data generated by a scriptor discussed below. In test mode, sample data flows out of the waveform generator 208 and to the data processor component 209 where the data is processed for 1) phasor estimation (converts the signal in time domain form to phasor representation in vector form); 2) frequency tracking (synchronizes the signal with the power system to make an accurate estimate of the phasor); and 3) protection calculations (process phasor data to determine a trip or no trip decision for output). This embodiment of the relay 100 of the present invention implements Data Processor 209 with phasor estimation and frequency tracking. The phasor estimation and frequency tracking, 210, is a non-limiting example of the microprocessor relay 100 with subcomponent 210 using frequency tracking capability for phasor estimation with a high level of correctness. In such a relay 100, the data generated by the waveform generation 208 are used for frequency tracking. This provides accuracy in phasor estimation when the relay 100 is in test mode (when relay 100 is a Relay-Under-Test (RUT)). The data preparation component 206 is also influenced. However the data from data preparation component 206 is not used when the relay 100 is in test mode (RUT). Similarly, when in normal mode, the samples from the data preparation component 206 are used for frequency tracking. This also influences the data from the waveform generator 208. Again this data is not used when the relay 100 is in normal mode. In an alternate embodiment of the relay 100 of the present invention, the process can be extended for use with other methods such as resampling to provide additional accuracy in phasor estimation.

In test mode, the simulator 200 creates digitized data substantially equivalent to data that can come from the power system. Hence, in test mode, the signal generator 208 provides digitization of actual power system data. This digitization of actual power system data provides the user with reliable data that the user can be comfortable with because the relay 100 response in simulation mode is substantially equivalent to the relay 100 response in normal mode under the substantially same conditions provided by the scripting. Trust of simulated data is imperative to the success of the integrated test system; without trust of data, the user or customer will not use the relay functions and will not realize the benefits of integrated test capabilities.

The signal or waveform generator 208 outputs data in actual values illustrated by component 212, 214; component 212 illustrates actual values output (i.e. for reporting purposes and for scripting to control the testing of the relay 100) and component 214 illustrates digital outputs which are also referred to as Flex Operands. The analog and digital outputs 212, 214 provide reporting and control script (explained herein, infra.). The analog outputs captioned Actual Values 212 in FIG. 2 of this embodiment of the present invention are floating point numbers and provide actual value of, for example, An, Fn, Hn and tn (which are defined in Tables A, B, C and D below).

The following TABLES summarize values and operands and provide general explanations of each, which are used in describing an embodiment of the relay 100 of the present invention. The operands and values in the TABLES can be found in formulas and figures used to describe the present invention:

TABLE A

Where - Time:

| | |
|---|---|
| t | Time |
| δt | Time difference between the current sample and the previous sample |
| u(t − td) | Unit step function |
| H | Harmonic number |

TABLE B

In Prefault Mode:

| | |
|---|---|
| A0 | Postfault amplitude setting |
| A1 | Prefault amplitude setting |
| F0 | Postfault frequency setting |
| F1 | Prefault frequency setting |
| HC0 | Postfault harmonic content setting |
| HC1 | Prefault harmonic content setting |
| Δt | δt |

TABLE C

In Fault Mode:

| | |
|---|---|
| A0 | Prefault amplitude setting |
| A1 | Fault amplitude setting |
| F0 | Prefault frequency setting |
| F1 | Fault frequency setting |
| HC0 | Prefault harmonic content setting |
| HC1 | Fault harmonic content setting |
| Δt | Ramp setting (If set to zero then Δt = δt) |

TABLE D

In Postfault Mode:

| | |
|---|---|
| A0 | Fault amplitude setting |
| A1 | Postfault amplitude setting |
| F0 | Fault frequency setting |
| F1 | Postfault frequency setting |
| HC0 | Fault harmonic content setting |
| HC1 | Postfault harmonic content setting |
| Δt | δt |

In the block diagram of FIG. 2 (which is suggested to be reviewed along with FIG. 14) it should be noted that the test mode and normal mode are mutually exclusive. Therefore, false operations of the power system that often happen during relay testing are avoided. The advantage is that the relay 100 operating as a Relay-Under-Test will not drop customers (also referred to as dropped load). Note that during test mode there is no output to the trip coil 102 (shown in FIG. 14). The relay 100 of the present invention, operating as a Relay-Under-Test is simple and tests are easily performed.

Figure 3:
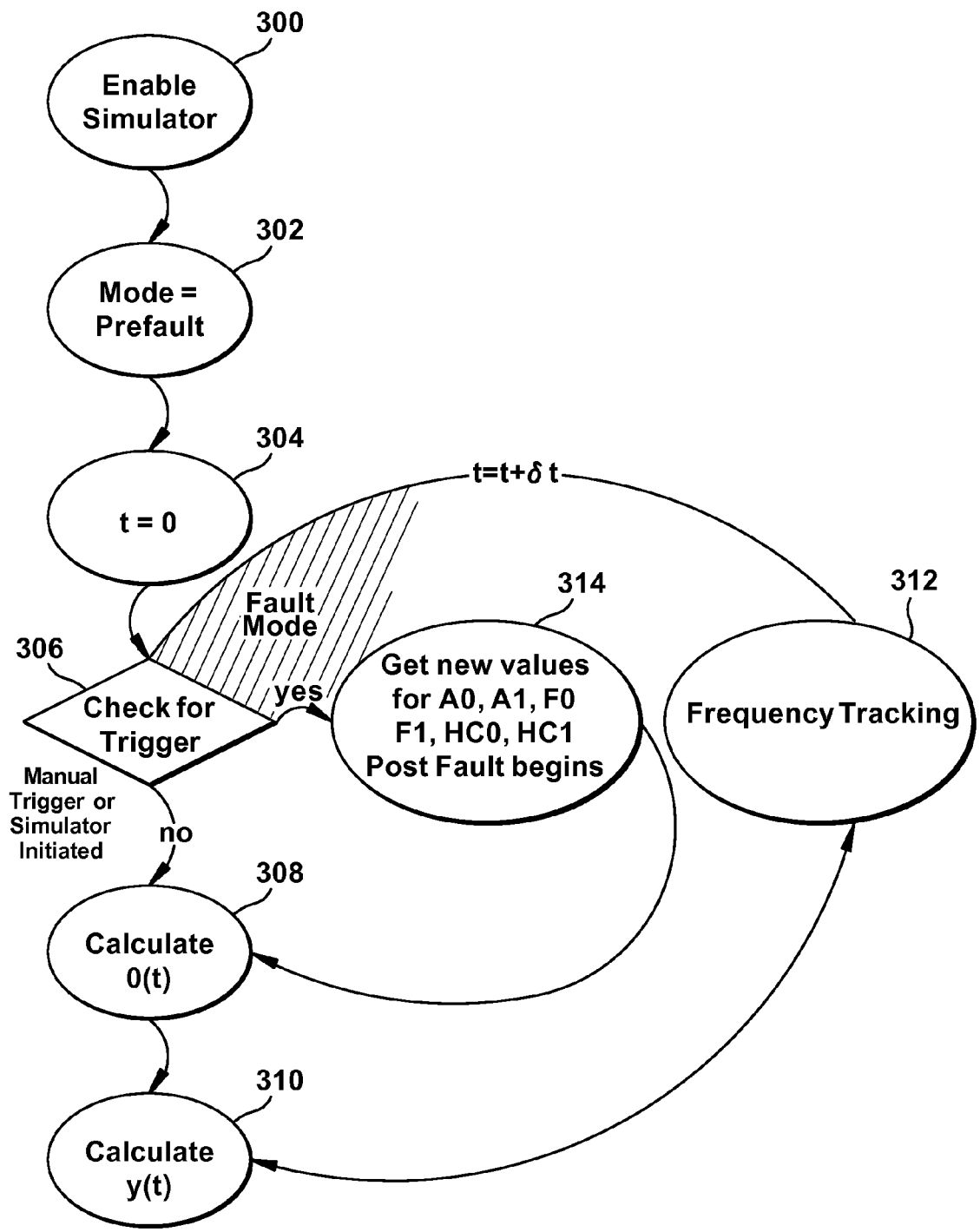
FIG. 3 illustrates a state diagram of an embodiment of the present invention, a relay with integrated test capabilities, detailing an overall process of the relay with integrated test capabilities.

FIG. 3 illustrates a state diagram of an embodiment of the present invention, a relay with integrated test capabilities, detailing an overall process of the relay with integrated test capabilities during test mode. Under test mode the relay is operating according to the present state diagram; whereas normal or typical operating conditions would have a different state diagram as could be determined by one of ordinary skill in the art.

In FIG. 3 as illustrated, a transition from a start-up state 300 to a test state 304 is made where the user or operator triggers the relay to simulate a fault. Between the start up state 300 (also referred to as enable simulator) and the test state 304 (also referred to as trigger) is a prefault mode 302 where conditions prior to the fault mode are seen and normal simulator voltage (Vs), current (Is), amplitude (A), frequency (f) and phase angle (φ) are defined (refer also to TABLES A through D supra.).

At state 306 a check for trigger is made. The relay may check for a manual trigger or a simulator initiated trigger at state 306. Note that the shaded area adjacent to the state 306 operand indicates the fault mode and that at state 314 the post fault mode begins and new values are obtained for operands A0, A1 F0, F1, HC0 and HC1. If there is no trigger at state 306 then the relay operates in the prefault state through states 308, 310 and 312 until a trigger presence is determined at state 306. If a trigger state is determined at state 306, then the relay operates to obtain fault state values for operands such as, for example, fault amplitude (A0, A1), fault frequency (F0, F1), and harmonic content (HC0, HC1). These values vary in name and magnitude depending upon which mode the relay is determined to be in after trigger. In the present exemplary state diagram of FIG. 3, the relay 100 of the present invention, operating as a Relay-Under-Test, is in fault mode; however, in alternate states relay 100 could be in prefault or postfault mode after trigger. One of ordinary skill in the art could determine an appropriate state diagram for each of the various triggers and states.

Returning to FIG. 3, in the prefault state, an embodiment of the relay 100 of the present invention operates to detect fault conditions which necessitate transition to the fault state (i.e. tripping of the relay, and later transition to the post fault or prefault states). Such faults include for example, ground faults, load losses, phase faults, including phase sequence errors, phase losses, and phase unbalance.

FIGS. 4 through 9 illustrate exemplary waveforms that are provided by a simulator component 200 of an embodiment of the present invention, a relay 100 with integrated test capabilities. The exemplary relay 100 of the present invention reacts to these waveforms in a prescribed manor i.e. trip, no trip, block outgoing signal in simulation mode, etc. Several exemplary waveforms include Step Magnitude Change of FIG. 4, Magnitude Ramp of FIG. 5, Phase Angle Step Change of FIG. 6 (where discontinuity is shown encircled by dotted line), Frequency Ramp of FIG. 7, Harmonic Ramp of FIG. 8 and Phase Angle Ramp of FIG. 9. Other waveforms can be generated by one of ordinary skill in the art to model normal and abnormal waveforms that can be seen on a power system. The waveforms are generated by a signal or waveform generator component 208 of the simulator 200. The waveform generator component 208 is programmed with general equations that generate various waveforms that are translated into code that resides in firmware of an embodiment of the relay 100 of the present invention. The general equation for each signal generator is:

$$y(t) = A(t) \cdot [\sin(\theta(t)) + HC(t) \cdot \sin(H \cdot \theta(t))]$$

$$A(t) = A_0 \cdot [1 - u(t - tr)] + \left[\frac{A_0 \cdot (\Delta t - \delta t) + A_1}{\Delta t} \cdot (t - tr)\right] \cdot$$
$$u(t - tr) \cdot [1 - u(t - \Delta t)] + A_1 \cdot u(t - tr - \Delta t)$$

$$HC(t) = HC_0 \cdot [1 - u(t - tr)] + \left[\frac{HC_0 \cdot (\Delta t - \delta t) + HC_1}{\Delta t} \cdot (t - tr)\right] \cdot$$
$$u(t - tr) \cdot [1 - u(t - \Delta t)] + HC_1 \cdot u(t - tr - \Delta t)$$

$$\theta(t) = \theta(t - \delta t) + 2 \cdot \pi \cdot F_0 \cdot \delta t \cdot [1 - u(t - tr)] +$$
$$\frac{(\theta_1 - \theta_0) \cdot \pi}{180 \cdot \Delta t} \cdot u(t - tr) \cdot [1 - u(t - tr - \Delta t)] + \left[\frac{F_0 \cdot (\Delta t - \delta t) + F_1}{\Delta t}\right] \cdot$$
$$(t - tr) \cdot u(t - tr) \cdot [1 - u(t - \Delta t)] + 2 \cdot \pi \cdot F_1 \cdot \delta t \cdot u(t - tr - \Delta t)$$

Figure 12:
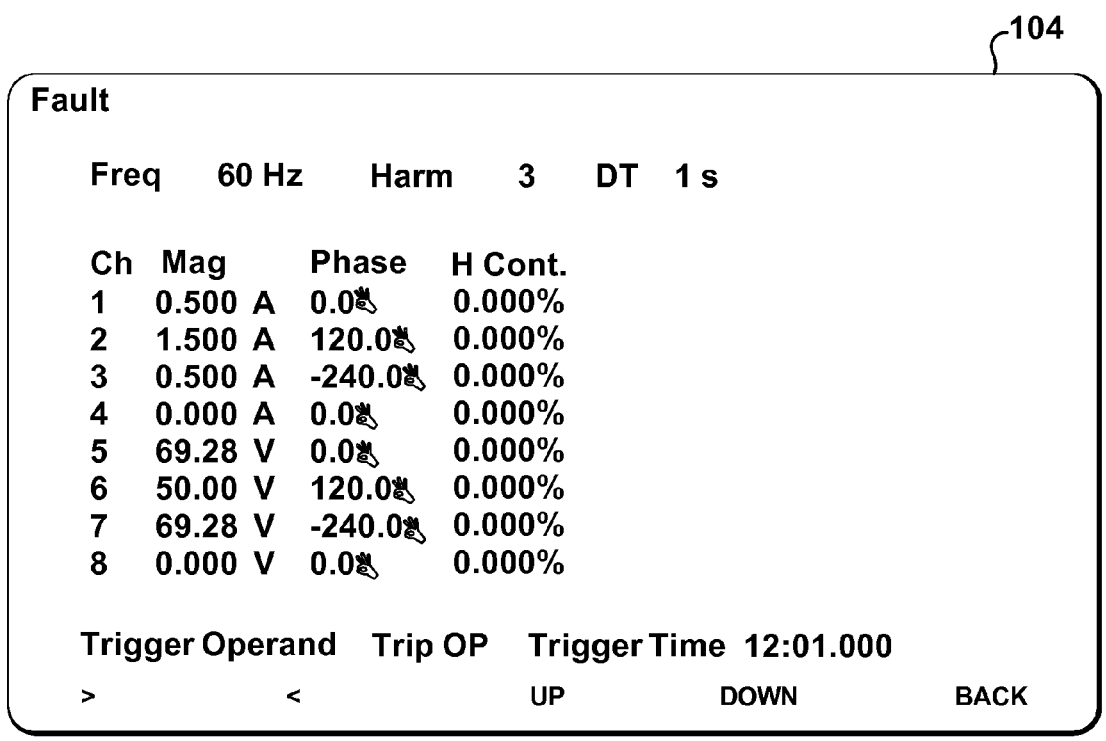
Figure 13:
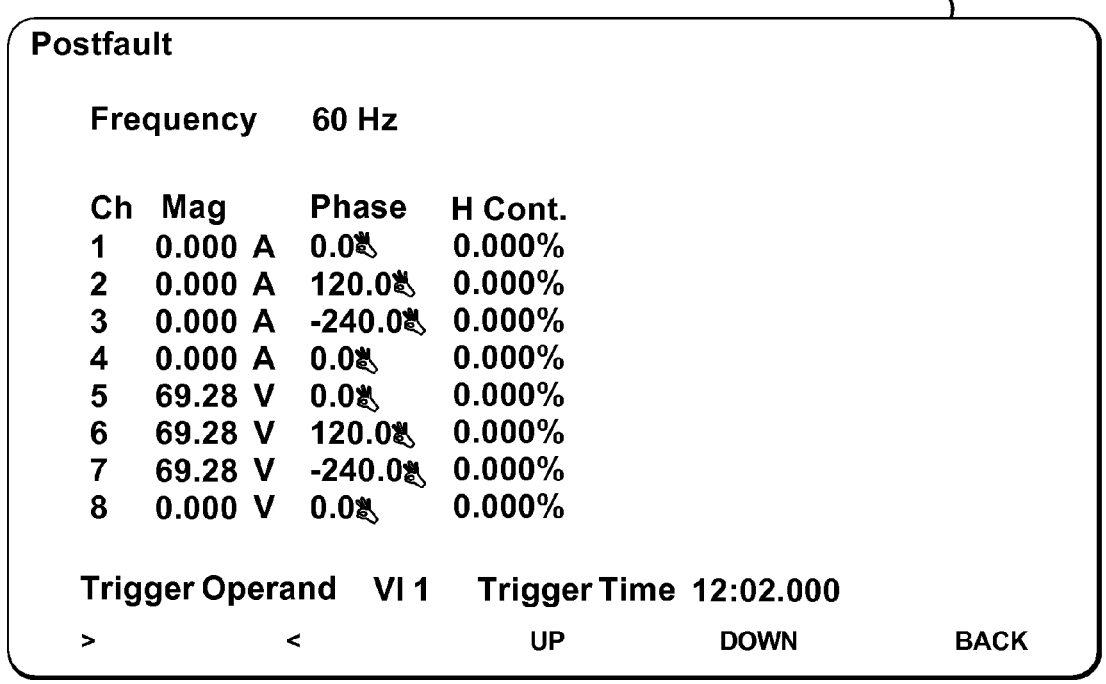

FIGS. 10 through 13 illustrate exemplary screen shots of the human machine interface (HMI) 104 (see FIG. 14) of an embodiment of the present invention, a relay 100 with integrated test capabilities. FIG. 10 is an exemplary screen shots of the human machine interface 104 of an embodiment of the present invention illustrating simulation mode configuration data. The configuration data determines the time response of the waveform generators. FIG. 11 is an exemplary screen shots of the human machine interface 104 of an embodiment of the present invention illustrating prefault mode configuration data. FIG. 12 is an exemplary screen shots of the human machine interface 104 of an embodiment of the present invention illustrating fault mode configuration data. FIG. 13 is an exemplary screen shots of the human machine interface 104 of an embodiment of the present invention illustrating postfault mode configuration data. Each screen shot has eight exemplary channels; however, the exemplary screen shot is not meant to limit the invention to eight channels of configuration data. Other numbers of configuration data may be determined by one of ordinary skill in the art. Each exemplary screen shot displays frequency (f) harmonics (H), channel (CH), magnitude (A) of current and voltage, phase (ϕ), and harmonic content (HC). In prefault mode, fault mode and postfault mode of FIGS. 11, 12 and 13, respectively, trigger operand and trigger time are displayed. In fault mode of FIG. 12, trigger OP is displayed; note that OP abbreviates operate and is an operand that signals that a particular protection function has operated. On the simulation mode screen shot of FIG. 10, prefault time, fault time and simulation mode (i.e., enabled, disabled) are displayed. The screen shots of FIGS. 11 through 13 are provided as examples and are not meant to limit in scope the types of data that are incorporated into the screenshots of the human machine interface 104. In foregoing examples, three simulator states are presented: prefault, fault, and post-fault. The simulator could include more or less than three states as could be determined by one of ordinary skill in the art. The screen shots could alternately be viewed on a personal computer 106 (see FIG. 14) which can be connected to an embodiment of the relay 100 of the present invention for downloading script data.

Script data is created using a scripting facility; the scripting facility (not shown) can be understood by one of ordinary skill in the art. The scripting facility feature allows the user to create a series of tests designed to confirm the correct operation of the subsystems of the relay. For each of these tests, configuration data and trigger conditions are calculated and downloaded to the simulator 200. After each test, simulation results may be retrieved and compiled.

The scripting facility supports variable types including for example, integer, real and strings and arrays. Math operators, for example: (+, −, *, /, ˆ, ++, −−) and relational operators (>, >=, <, <=, ==, !=, &&, ||) are also included. Math functions such as (sqrt, log, ln, exp, abs, max, min, round, sin, cos, tan, asin, acos, atan) are also available. Loops, IF statements, and file I/O for example, are supported by an embodiment of the present invention. In addition, the following relay I/O functions can be used to download simulator configuration data and to retrieve simulation results for analysis by the user:

TABLE E

| Function | Explanation |
| --- | --- |
| Relay I/O Functions | |
| setprefault(CH, A, F, υ, HC) | Set prefault values |
| setfault(CH, A, F, υ, H, HC, DT) | Set fault values |
| setpostfault(CH, A, F, υ, HC) | Set postfault values |
| resetprefault( ) | Set all prefault values to zero |
| resetfault( ) | Set all fault values to zero |

TABLE E-continued

| Function | Explanation |
| --- | --- |
| Relay I/O Functions | |
| resetpostfault( ) | Set all postfault values to zero |
| switchtoprefault(FO) | Set prefault trigger |
| switchtofault(FO) | Set fault trigger |
| switchtopostfault(FO) | Set postfault trigger |
| setactivegroup | Force active setting group |
| setvirtualinput(n) | Set virtual input n to 1 |
| resetvirtualinput(n) | Set virtual input n to 0 |
| readfaultmag(CH) | Read fault magnitude |
| readfaultfreq(CH) | Read fault frequency |
| readfaultphase(CH) | Read fault phase angle |
| readfaultharm(CH) | Read fault harmonic content |
| readfaulttime( ) | Read fault time |
| Wait(FO) | Wait until Flex-operand is true |

TABLE F

| Abbreviation | Explanation |
| --- | --- |
| Other Values and Operands | |
| CH | Channel Number |
| A | Magnitude |
| F | Frequency |
| υ | Phase Angle |
| H | Harmonic number |
| HC | Harmonic Content |
| DT | Ramp Time |
| FO | Flexlogic Operand |

In the exemplary embodiment, scripting generation is performed on equipment separate from the relay 100 of the present invention. A user, such as a protection and control engineer, or a test engineer, or technician, can generate the script data. The user can make determinations such as an appropriate pickup current value. The user can perform a fault study on an impedance model of a power system. The output data can be used to generate script for input into an embodiment of the relay 100 of the present invention. The script upon input would trigger the relay 100 to perform as a Relay-Under-Test. In an embodiment of the present invention the scripting can be transmitted to the relay 100 over a communications network 105. The communications network 105 can be connected to the relay through a microprocessor based personal computer 106 or other suitable connection as could be performed by one of ordinary skill in the art. The receipt of the script can then trigger the relay 100 into test mode to function as a Relay-Under-Test. In another embodiment of the relay 100 of the present invention, the data could be communicated to the relay remotely and the testing could be automated. Alternately testing could be carried out remotely. One of ordinary skill in the art would be able to perform networked communications, remote and/or automated testing of an embodiment of the relay 100 of the present invention.

The data prepared using the scripting process provides the user with a comfort level where the user feels that the generated test implemented in the relay 100 of the present invention is substantially the same as a typical physical test performed by the user with prior art external test equipment 97 on prior art relay 99 such as the prior art illustrated in FIG. 1. Hence the script, which is a set of instructions for one or more tests of the relay 100, needs to be trusted. With scripts generated separate from the relay 100, the relay will not know that it is seeing a simulated signal; hence the relay will not know the source of the data. The desire is for the user to have a high comfort level with the data. The typical user or test scripter is conservative by nature given that load (i.e. customers) can be dropped by a problematic test set-up. Hence, a high confidence in the data would prompt a user or the like to embrace the testing capabilities of the exemplary relay 100 of the present invention.

Figure 14:
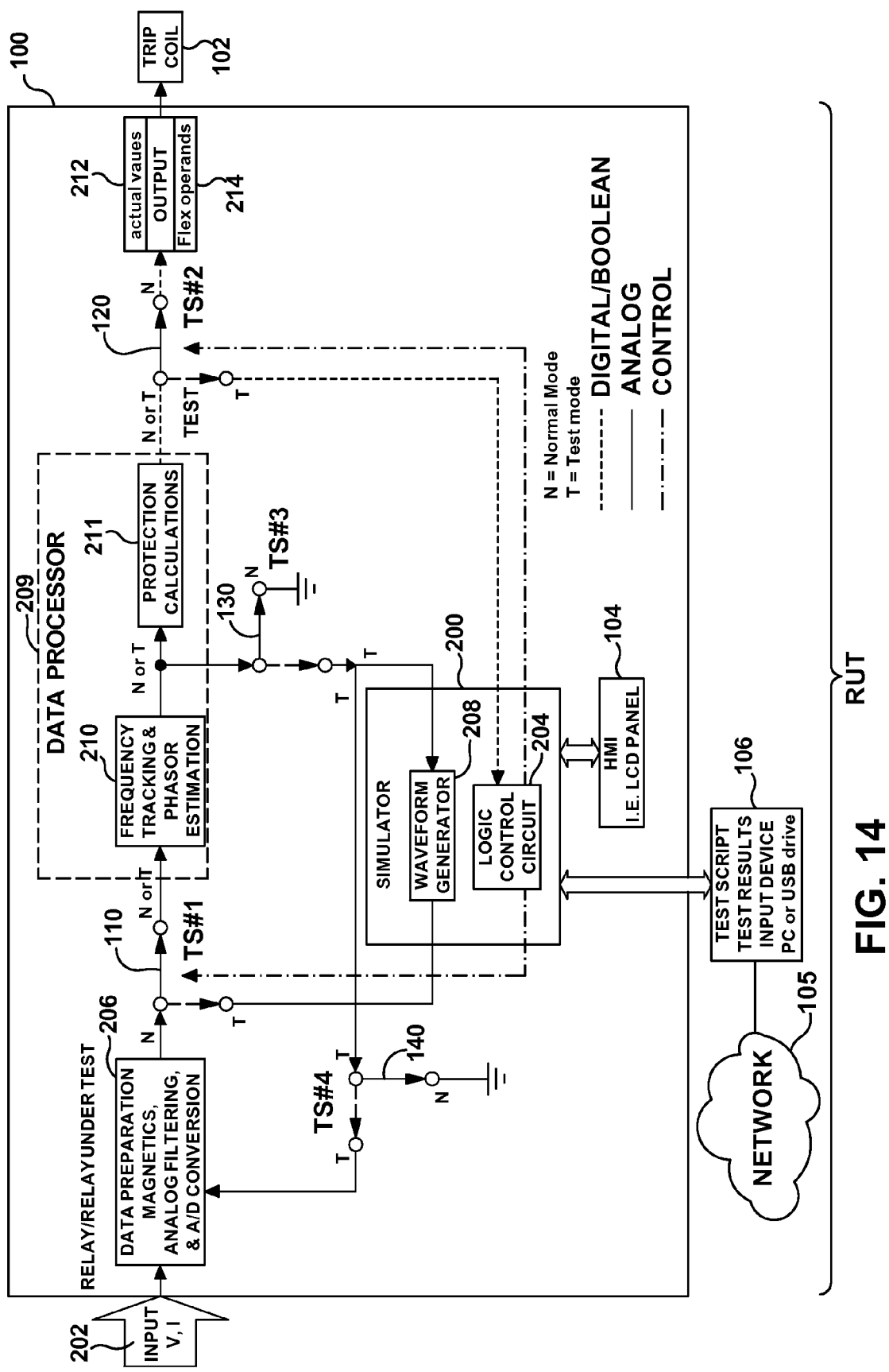
FIG. 14 illustrates a functional block diagram of an embodiment of the present invention, a relay with integrated test capabilities, detailing normal and test operation (Relay-Under-Test) of the relay with integrated test capabilities.

FIG. 14 illustrates a functional block diagram of an embodiment of the present invention, a relay 100 with integrated test capabilities, detailing normal and test operation (Relay-Under-Test) of the relay 100 with integrated test capabilities. The relay 100 of the present invention is capable of functioning as a Relay-Under-Test, without the need for external test equipment 97 illustrated in the prior art test equipment 97 and relay 99 of FIG. 1.

FIG. 14 further illustrates the circuitry of the exemplary relay 100 of an embodiment of the present invention. The modes illustrated in FIG. 14 are Normal mode (N) and Test mode (T). Test mode is initiated when there is a connection such as, for example, a personal computer or a USB data drive 106 to the relay 100 which then functions as a Relay-Under-Test since the connection triggers the relay to change from a prior mode (such as Normal mode) to Test mode. The relay 100 could change modes in other ways such as an external switch; mode change alternatives can be determined by one of ordinary skill in the art. If a personal computer (PC) 106 is used to initiate test mode, the PC 106 communicates to the relay 100 to hold the test script and to receive script from the simulator 200. If a USB memory device is used to initiate test mode, the relay is configured to hold test script upon recognition of the USB device 106 connection and then the Human Machine Interface 104 initiates the test.

An embodiment of the relay 100 of the present invention includes internal test circuitry (i.e. test switches, data processor, simulator) so that a user having relatively limited knowledge or experience with relays and electrical power systems can test the relay 100 with limited interface. The testing of relay 100 of the present invention is initiated, for example, through the use of a USB memory device or a personal computer 106. Through the use of a USB device 106 or a simple PC connection 106, the user with relatively limited knowledge and experience can perform testing of the relay 100 of the present invention. An embodiment of the relay 100 of the present invention simplifies the complex field test procedures associated with prior art external test equipment 97 illustrated, for example, in FIG. 1.

Returning to the block diagram of FIG. 14, and assuming that the relay 100 of the present invention has received test script as explained above, the relay changes to test mode, where test switch #1 is open, test switch #2 connection to Outputs 212 is open, test switch #3 is closed and test switch #4 is closed. This configuration allows for the proper test circuit to operate employing Data Processor 209 (including processing components 210, 211) and simulator 200 with logic circuit 204 and waveform generator 208. Note that in test mode, the relay 100, also known as the Relay-Under-Test is unable to operate trip coil 102 and also does not send output data to outputs 212, 214. The block diagram additionally illustrates digital or Boolean connections, analog connections and control via the key present illustrated in FIG. 14. With respect to the digital and analog connections, it should be noted that the output signal from block 206 is a digitized representation of the analog values of the input voltage and/or current; further, the notations stating digital signals are referencing Boolean rather than digital. In the relay 100 of the present invention, it can be considered that the signals in the relay 100 are digital as would be understood by one of ordinary skill in the art.

In an alternate embodiment (indicated by phantom switches #3 and #4, 130 and 140, respectively, of FIG. 14), the block diagram of FIG. 14 comprises two test switches; test switch #1, 110, and test switch #2, 120. Test switches #3 and #4, 130 and 140, respectively, can be omitted; hence when test switches #1 and #2, 110 and 120, respectively, are in normal mode data where flows to both the simulator 200 and the data preparation component 206 without any additional result; the elimination of the switches #3 and #4, 130 and 140, respectively, simplifies the implementation.

Figure 15:
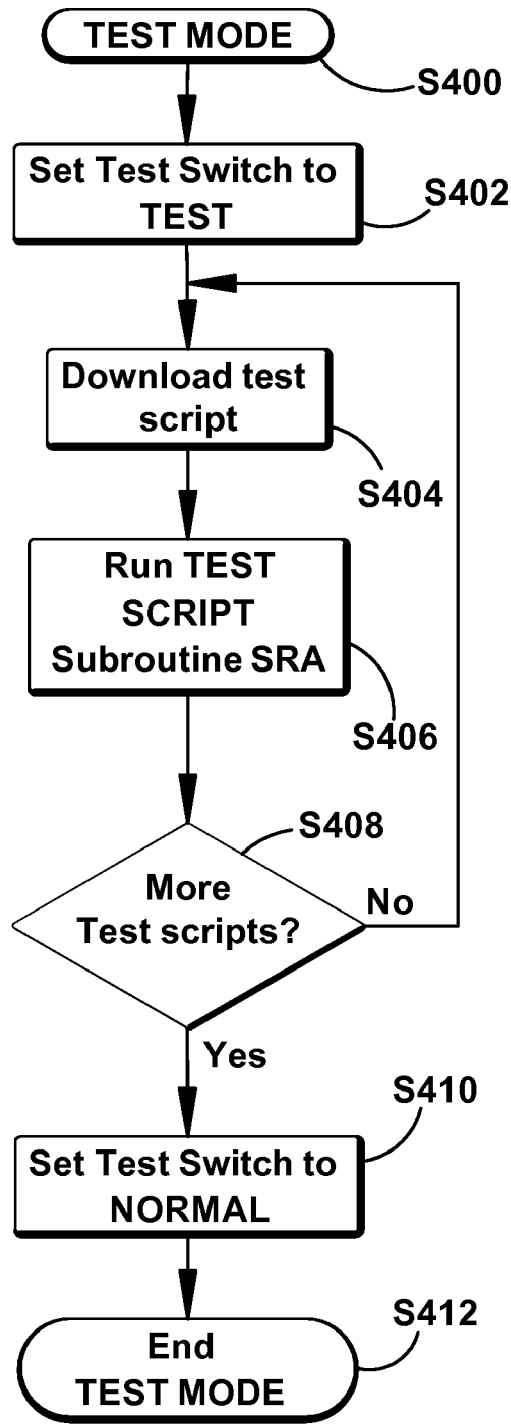
FIGS. 15 through 17 illustrates a set of exemplary flow chart of an embodiment of the present invention, corresponding to the functional block diagram of FIG. 14 detailing test operation (Relay-Under-Test) of the relay with integrated test capabilities.
Figure 16:
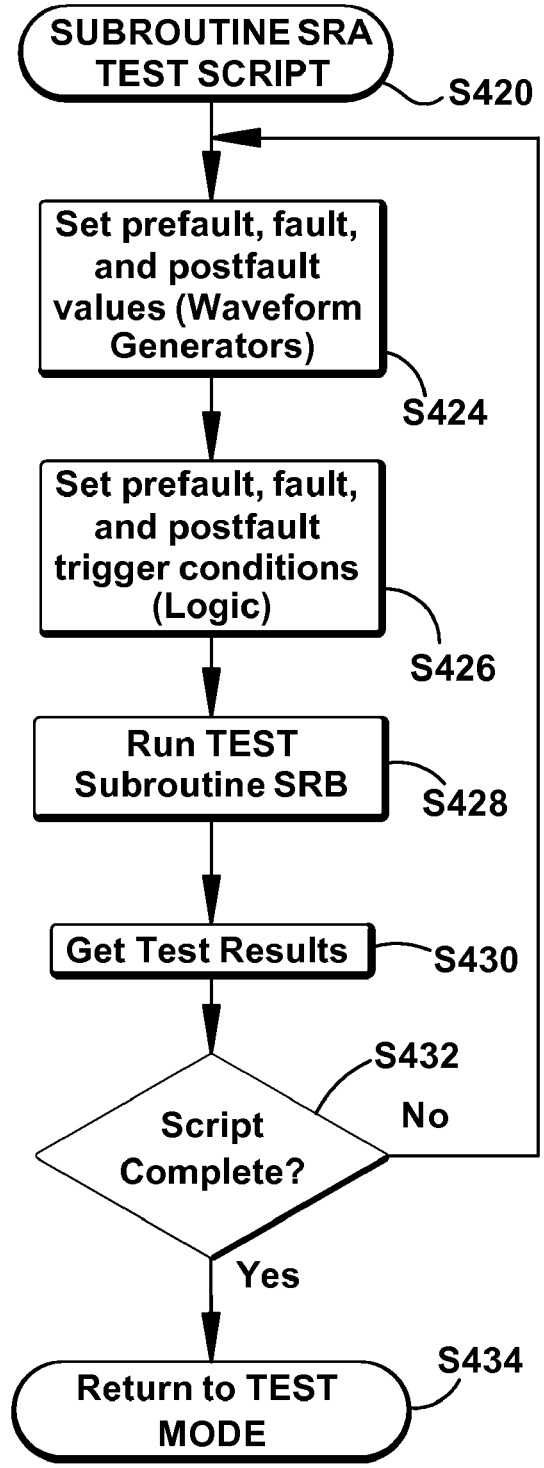
Figure 17:
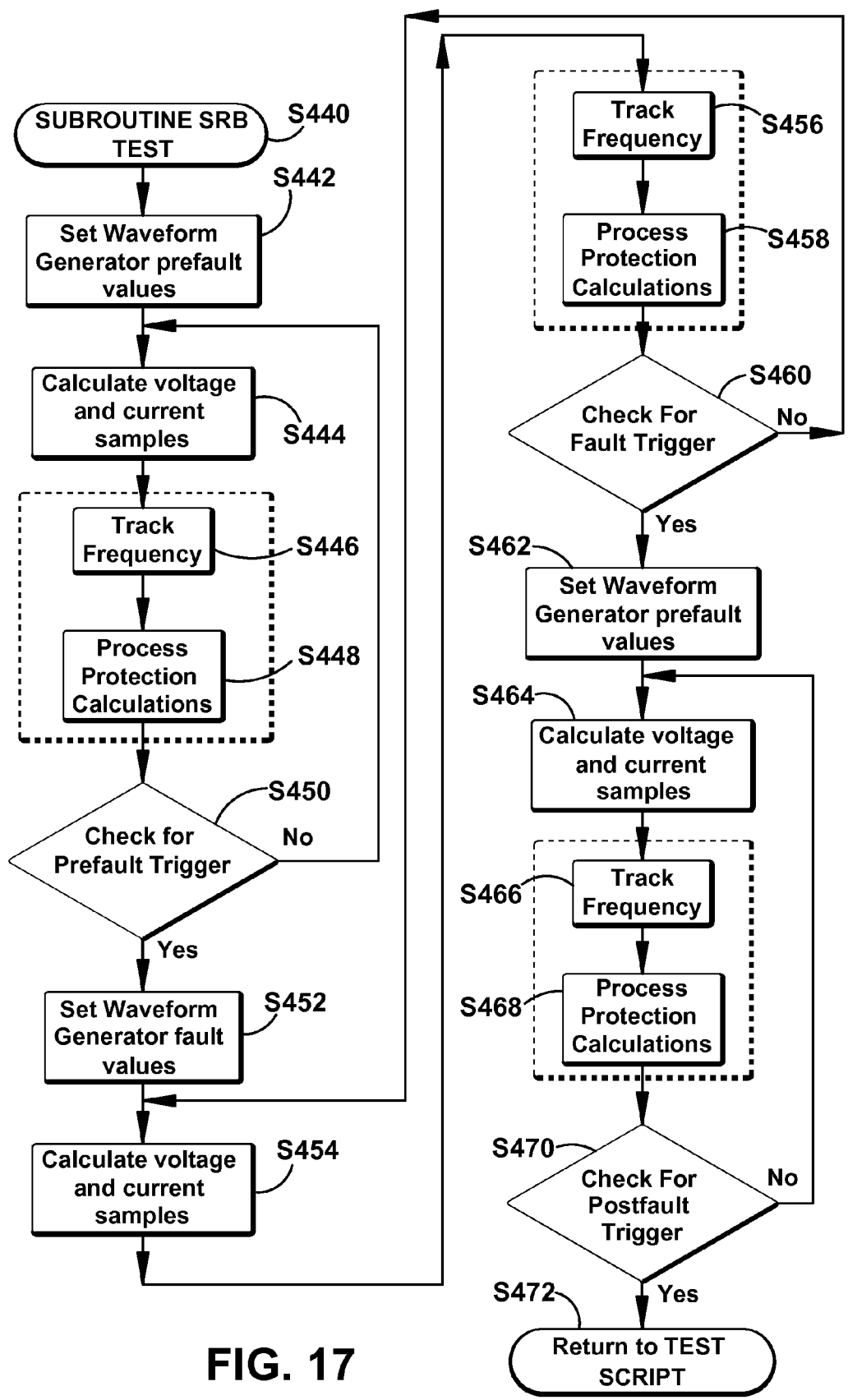

FIGS. 15 through 17 illustrate a set of exemplary flow charts of an embodiment of the present invention, corresponding to the functional block diagrams of FIGS. 2 and 14 detailing test operation (Relay-Under-Test) of an embodiment of the relay 100 of the present invention with integrated test capabilities. The flow charts comprise a main flow chart of FIG. 15, labeled Test Mode and two subroutines: 1) Test Script Subroutine SRA of FIG. 16, and 2) Test Subroutine SRB of FIG. 17.

Beginning at FIG. 15, in step S400, test mode begins, the relay 100 of the present invention is a Relay-Under-Test. Next, at step S402 the test switch 110 (of FIG. 2) is set to test. Test script is then downloaded at step S404 and run test script (subroutine SRA) at step S406 is performed. Down load is performed using input device 106 (of FIG. 14). At step S408, a query is made as to whether additional test scripts will be input. If the answer to the query of step S408 is no, then the next step is to set the Test switch 110 (of FIG. 14) to normal at step S410 and end test mode at step S411. If the answer to the query of step S408 is yes, then the subroutine Test Script, labeled SRA in FIG. 15 is performed.

With respect to subroutine SRA of FIG. 16 or the test script subroutine, at step S420 the test script subroutine SRA begins. Next at step S422 prefault, fault and post fault values are set using waveform generators 208 (of FIGS. 2 and 14). Step S422 corresponds to screen shots for the modes described in the step, for example, and to screenshot FIGS. 11 through 13. Further, at step S424, prefault, fault and postfault trigger conditions are set using the logic control circuit 204 (of FIGS. 2 and 14). Each of the modes of step S424 is a predetermined mode and is illustrated for exemplary purposes; the values and triggers used in this step can be compared to those used in setting up a conventional test set of the prior art (for example, the test equipment 97 of FIG. 1 (which illustrates the use of test equipment external to the relay). A comparison of FIG. 1 RUT and FIG. 14 RUT, illustrates differences between prior art relay 99 and present invention exemplary relay 100. The relays being tested are each distinguished by a bracket and the indication RUT adjacent to each relay 99 (prior art) and 100 (present invention). An important distinguishing factor between the prior art and the present invention is that the relay of the present invention does not require prior art test equipment 97. This represents a significant capital cost savings for the use or customer. It also allows tests to be carried out much more quickly and efficiently (again saving money). In an alternate embodiment, the relay 100 of the present invention could be tested by initiating the test remotely or by automating the test. A network connection 105 i.e. LAN connection, could be provided for connection to the relay so that remote testing could be performed.

Furthermore, a significant number of mal-operations in the substation are a direct result of mistakes made during testing. Some arguments have been made that periodic relay testing creates more problems than it solves. Software or firmware based testing, such as that of the present invention, is far less intrusive since it is not necessary to isolate the relay from the system during the test and re-connect it afterwards (although some users may want to perform the isolation based upon habit and this isolation is not precluded by the present invention).

Returning to the exemplary relay of FIG. 14, the values and triggers define parameters for the waveform generator 208; Equations define the characteristics of the generated waveforms. The triggers act to prompt the waveform generator to change for a present state to a next state (for example, an overcurrent trigger flag is a pickup flag). Hence the trigger is a signal provided by the internal flag(s) (not shown) of relay 100 and controls the active states of the waveform generator 208 (i.e. fault, prefault, postfault, simulator modes). In an alternate embodiment, the trigger could come from the HMI 104 and would be determined by the user that prepares the script(s). In the present embodiment, for example, logic control circuit 204 illustrates triggers. The internal function generators are controlled from external software or script (not shown). The software monitors the response of the relay 100 and compiles a report of the testing results. The testing results are output as described infra.

Returning to the flowchart of subroutine SRA, FIG. 16, at step S426 a test is run; the test is labeled subroutine SRB. Following subroutine SRB is step S428 where the relay 100 waits for at least one trigger. The test results are obtained at step S430 using outputs 212, 214 (of FIGS. 2 and 14). Next, a query is made as to whether the script is complete. If the answer is NO, then steps S422, S424, S426, S428 and S430 process again and are followed by the query step S432 again questioning whether the script is complete. When the answer to query step S432 is YES, then the return to test mode step S432 is performed. Test mode is outlined in the main flowchart of FIG. 15, steps S400 through S412.

Returning to subroutine SRB of step S426, the test mode is run following the steps of the subroutine SRB flowchart of FIG. 17. At step S440, subroutine SRB test begins. Subroutine SRB processes through similar steps in each of its three sets of steps leading up to queries of steps S450, S460 and S470. The queries of S450, S460 and S470 check for triggers and correspond respectively to checking for prefault, fault and postfault triggers. After step S440 beginning the test, the prefault values are set at step S442 by waveform generator 208. Exemplary waveforms for this step are illustrated in FIGS. 4 through 9. Next at step S444, voltage and current samples are generated. At step S446, frequency tracking is performed and is followed by step S448 where protection calculations are processed. At step S450, a prefault trigger determination is made. If no prefault trigger is present, steps S442, S444, S446 and S448 repeat. If a prefault trigger is present, the subroutine SRB passes to the next step, S452, which is part of the fault mode. The prefault trigger is an internal relay flag that controls the waveform generator from prefault mode to fault mode; the prefault trigger can be performed through the use of the HMI 104 or alternately, a push button on the relay (not shown).

The fault values are set at step S452 by waveform generator 208. Exemplary waveforms for this step are illustrated in FIGS. 4 through 9. Next at step S454, voltage and current samples are generated. At step S456, frequency tracking is performed and is followed by step S458 where protection calculations are processed. At step S460, a prefault trigger determination is made. If no prefault trigger is present, steps S452, S454, S456 and S458 repeat. If a fault trigger is present, the subroutine SRB passes to the next step, S462, which is part of the fault mode.

The postfault values are set at step S462 by waveform generator 208. Exemplary waveforms for this step are illustrated in FIGS. 4 through 9. Next at step S464, voltage and current samples are generated. At step S466, frequency tracking is performed and is followed by step S468 where protection calculations are processed. At step S460, a prefault trigger determination is made. If no prefault trigger is present, steps S462, S464, S466 and S468 repeat. If a postfault trigger is present, the subroutine SRB passes to the next step, S472 and returns to the test script subroutine SRA. At test script subroutine SRA of FIG. 16, the relay waits for a trigger at step S428, gets test results at step S430 and queries as to whether the script is complete at step S432. If the answer to the query is yes, the relay is returned to test mode at step S434. Upon returning to test mode step S400 of the main flowchart FIG. 15, the relay 100 performs the steps previously described for the main flow chart and ends test mode at step S412.

It should be noted that in Test subroutine SRB of FIG. 16, steps S446 and S448 perform the steps of frequency tracking and processing protection calculations, respectively, for prefault mode. Steps S456 and S458 process similar steps for fault mode and steps S466 and S468 process similar steps for post fault mode. Each of these pairs of steps is illustrated with dotted lines around them in FIG. 15. In an alternate embodiment, the track frequency step S446, S456 and S466 can be replaced by a resample step which could be performed by one of ordinary skill in the art. The dashed line around each set of steps, S446 and S448; S456 and S458; and S466 and S468 are indicative of two steps that relays typically process through; the difference between a typical Relay-Under-Test and the relay of the present invention is that the present relay does not know that the data is simulated; the data appears to the relay as actual data from the physical environment that is interconnected to the relay. Since testing of the relay of the present invention could be performed more quickly which translates to decreased testing costs and increased relay availability when the cost savings is spent on implementation of additional relays of the present invention. Further, the software and firmware reduce the possibility of incorrect test results. Software and firmware based testing minimizes this possibility of human error and dropped load.

While subroutine SRB of FIG. 17 illustrates testing of the relay in prefault mode, fault mode and postfault mode, these illustrations are not meant to be limiting; other modes or states could be performed by the relay as may be determined by one of ordinary skill in the art.

Although the above-relay is described as performing in several modes, those of ordinary skill in the art will understand that within the scope of the claimed invention, other applications include, but are not limited to, the modes illustrated in the embodiments of the relay 100 of the present invention.

The relay of the present invention can be performed because a suitable relay platform with internal processing power and local interfaces supports the functionality of the present invention. Previously, microprocessor based relays have had less processing power and less networking capability. Because of the availability of components designed and manufactured for the relay 100 of the present invention, the test mode or RUT can be performed. This provides a significant cost savings to the user or customer. For example, a customer can save in training, engineering, wiring and preparation. Test equipment vendors do not have the capability to provide a relay with test functionality since test equipment vendors do not design or manufacture relays; providing a relay with internal test capability would be counterintuitive to a test vendor's product offering. These are among the many reasons that the relay 100 of the present invention has not previously been available.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A relay device having a normal mode and a relay under test mode, comprising:
   at least one mode change device for changing the relay device from a normal mode to a test mode;
   an interface for receiving test script from a source;
   a logic device for providing a logic output;
   a waveform generator for receiving the logic output when the relay device is in test mode, wherein the waveform generator is configured to set test mode fault values, the waveform generator being further configured to receive test script from the interface and output test data results;
   a data preparation component for receiving power system input data, the power system input data comprising a current sample and a voltage sample and the data preparation component configured for preparing the power system input data for processing;
   a data processor for performing phasor estimation and frequency tracking of the test mode fault values and the power system input data and the data processor performing protection calculations on the test mode fault values and the power system input data; and
   an output connected to the data processor to receive results of the protection calculations for the power system input data when the relay device is in the normal mode.

2. The relay device of claim 1, wherein in the test mode, the mode change device is at least one test switch in a test position.

3. The relay device of claim 2, wherein when the at least one test switch is in the test position the data processor for performing phasor estimations and frequency tracking of the current and voltage samples from the power system input data provides test data results to the waveform generator.

4. The relay device of claim 2, wherein the at least one test switch for switching the relay device from the normal mode to the test mode comprises four test switches.

5. The relay device of claim 1, wherein the source is a USB input data device connected to the relay device and wherein the USB input device also acts as the mode change device.

6. The relay device of claim 1, wherein the source is a PC connected to the relay device and wherein the PC connected to the relay also acts as the mode change device.

7. The relay device of claim 1, wherein the source is a network in receipt of an input signal and wherein the input signal also acts as the mode change device.

8. The relay device of claim 7, wherein the input signal for the mode change device is received from a remote operator.

9. The relay device of claim 1, wherein the mode change device is a test button for switching the relay device to test mode.

10. The relay device of claim 1, the relay device further comprises a human machine interface at the relay device.

11. The relay device of claim 1, wherein the data processor for performing phasor estimation and frequency tracking of the current and voltage samples from the power system input data and performing protection calculations to determine the output of the relay uses resampling.

12. A method of operating a relay device in a normal mode and a relay under test mode, the method comprising the steps of
   switching the relay device from a normal mode to a test mode by operating a mode change device;
   providing an interface for receiving test script from a source;
   providing a logic output from a logic device;
   generating a waveform for at least one test mode fault value for running the test script received from the interface and outputting test data results;
   preparing power system input data for further processing using a data preparation component, the power system in put data comprising a voltage sample and a current sample;
   performing phasor estimation and frequency tracking of the at least one test mode fault value and the power system input data using a data processor;
   performing protection calculations on the at least one test mode fault value and the power system input data using the data processor; and
   operating a trip coil in response to the results of the protection calculations for the power system input data when the relay is in the normal mode.

13. The method of operating the relay device as claimed in claim 12, further comprising the step of outputting actual test data values and outputting flex operands.

14. The method of operating the relay device as claimed in claim 12, wherein the step of performing phasor estimation uses resampling.

15. The method of operating the relay device as claimed in claim 12, further comprising the step of changing the relay device mode to test mode via a remote operation.

16. The method of operating a relay device as claimed in claim 12, further comprising the step of changing the relay device to test mode by operating the mode change device.

17. The method of operating a relay device as claimed in claim 16, wherein the mode change device is at least one test switch and wherein the test mode is provided by operating the at least one test switch to a test position.

18. The method of operating a relay device as claimed in claim 12, wherein the step of performing phasor estimations and frequency tracking of the current and voltage samples from the power system input data provides test data results.

* * * * *